United States Patent
Kobayashi et al.

(10) Patent No.: US 8,283,556 B2
(45) Date of Patent: Oct. 9, 2012

(54) NANOWIRE-BASED DEVICE AND ARRAY WITH COAXIAL ELECTRODES

(75) Inventors: Nobuhiko Kobayashi, Sunnyvale, CA (US); R. Stanley Williams, Portola Valley, CA (US); Shih-Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 841 days.

(21) Appl. No.: 12/247,860

(22) Filed: Oct. 8, 2008

(65) Prior Publication Data

US 2009/0188544 A1 Jul. 30, 2009

Related U.S. Application Data

(60) Provisional application No. 61/024,787, filed on Jan. 30, 2008.

(51) Int. Cl.
*H01L 31/00* (2006.01)
*H02N 6/00* (2006.01)

(52) U.S. Cl. .................. 136/255; 136/244; 257/E31.001

(58) Field of Classification Search .................. 136/255, 136/244, 252, 293; 257/E31.001
See application file for complete search history.

(56) References Cited

U.S. PATENT DOCUMENTS

| | | | |
|---|---|---|---|
| 6,969,897 B2 * | 11/2005 | Kim, II | 257/432 |
| 7,265,037 B2 | 9/2007 | Yang et al. | |
| 2005/0011431 A1 * | 1/2005 | Samuelson et al. | 117/40 |
| 2005/0064185 A1 | 3/2005 | Buretea et al. | |
| 2006/0207647 A1 | 9/2006 | Tsakalakos et al. | |
| 2007/0137697 A1 * | 6/2007 | Kempa et al. | 136/256 |

FOREIGN PATENT DOCUMENTS

WO    WO 2006/138671    * 12/2006

OTHER PUBLICATIONS

Mark S. Gudiksen et al., Size-Dependent Photoluminescence from Single Indium Phosphide Nanowires, J. Phys. Chem. B, 106 (2002) pp. 4036-4039.
Sreeram Vaddiraju et al., Mechanisms of 1D Crystal Growth in Reactive Vapor Transport: Indium Nitride Nanowires, Nano Letters, vol. 5, No. 8 (2005) pp. 1625-1631.
Pu Xian Gao et al., Three-dimensional Interconnected Nanowire Networks of ZnO, Chem. Phys. Letters, 408 (2005) pp. 174-178.
Wen-Ting Chiou et al., Growth of Single Crystal ZnO Nanowires using Sputter Deposition, Diamond and Related Materials, 12 (2003) pp. 1841-1844.
N. P. Kobayashi et al., Growth and characterization of indium phosphide single-crystal nanoneedles on microcrystalline silicon surfaces, Appl. Phys. A 85, (2006) pp. 1-6.
L. Tsakalakos et al., Silicon nanowire solar cells, Appl. Phys. Lett., 91 (2007) pp. 233117-1 to 233117-3.

* cited by examiner

*Primary Examiner* — Jonathan Johnson
*Assistant Examiner* — Tamir Ayad

(57) ABSTRACT

A nanowire-based photonic device and an array employ nanowires connecting between coaxially arranged electrodes in a non-uniform manner along a vertical extent of the electrodes. The device includes a pair of the electrodes separated by a circumferential gap. The nanowires chaotically emanate from an inner electrode of the pair and connect across the circumferential gap to an outer electrode of the pair. The array includes an outer electrode having an interconnected pattern of cells and inner electrodes, one per cell, arranged coaxially with and separated from the outer electrode by respective circumferential gaps. The nanowires chaotically emanate from the inner electrodes and connect across the respective circumferential gaps of the cells to the outer electrode. The device and the arrays further include a semiconductor junction between the electrodes.

20 Claims, 4 Drawing Sheets

NANOWIRE-BASED DEVICE AND ARRAY WITH COAXIAL ELECTRODES

CROSS-REFERENCE TO RELATED APPLICATION:

The present application claims priority from provisional application Ser. No. 61/024,787, filed Jan. 30, 2008, the contents of which are incorporated herein by reference in their entirety.

STATEMENT REGARDING FEDERALLY SPONSORED RESEARCH OR DEVELOPMENT

N/A

BACKGROUND

1. Technical Field

The invention relates to nanotechnology. In particular, the invention relates to a device that has nanowires incorporated between coaxial electrodes and an array of such devices.

2. Description of Related Art

Historically, high performance semiconductor devices, especially those with p-n junctions, comprise single crystals of one or more semiconductor materials. Among other things, using such single crystalline materials for semiconductor devices essentially eliminates the scattering of charged carriers (e.g., holes and electrons) at grain boundaries that exist in non-single crystalline semiconductor materials such as polycrystalline semiconductor materials. Such scattering adversely reduces the drift mobility and the diffusion of charged carriers, and leads to a degraded performance (e.g., increased resistance) of devices, such as transistors and solar cells. Even when different semiconductor materials were employed together in a single device, such as in a heterostructure or heterojunction device, single crystalline semiconductor materials are generally chosen based on their respective lattice structures to insure that the structure realized is an essentially single crystalline structure as a whole. Similarly, nanostructures including, but not limited to, nanowires and nanodots are typically nucleated and grown from single crystalline substrates, in part to capitalize on the uniform nature of the lattice of such substrates that provides required crystallographic information for the nanostructures to be grown as single crystals.

In addition to single crystalline semiconductors, amorphous and other essentially non-single crystalline semiconductor materials also have been attracting attention, in particular, in solar cell and silicon photonics applications. While having the disadvantages associated with multiple grain boundaries, such non-single crystalline semiconductor materials can be considerably cheaper to manufacture than their single crystalline counterparts. In many applications, the lower cost of producing the semiconductor device from non-single crystalline materials may outweigh any loss of performance that may or may not result. Furthermore, using non-single crystalline semiconductor materials for heterostructures can increase the possible combinations of materials that can be used since lattice mismatch is less of a concern with non-single crystalline semiconductors.

For example, heavily doped polycrystalline silicon (Si) is commonly used instead of or in addition to metal for conductor traces in integrated circuits where the heavy doping essentially overcomes the increased resistivity associated with carrier scattering from the multiple grain boundaries. Similarly, polycrystalline Si is commonly used in solar cells where its relatively lower cost outweighs the decrease in performance associated with the nature of the polycrystalline material. Amorphous semiconductor material is similarly finding applications in solar cells and in thin film transistors (TFTs) for various optical display applications where cost generally dominates over concerns about performance.

Unfortunately, the ability to effectively combine non-single crystalline semiconductor materials with single crystalline semiconductor materials to realize semiconductor junction-based devices and heterostructure or heterojunction devices has generally met with little success. In part, this is due to the disruptive effects that joining a single crystalline layer to a non-single crystalline layer has on the physical properties of the single crystalline layer. As such, devices that employ nanostructures as active elements typically use single crystalline materials to interface to single crystalline nanostructures. For example, solar cell devices that incorporate nanowires employ single crystalline materials to form semiconductor junctions.

BRIEF SUMMARY

In some embodiments of the present invention, a nanowire-based photonic device is provided. The photonic device comprises a pair of electrodes in a coaxial arrangement separated by a circumferential gap on a substrate. The pair of electrodes has a vertical extent and is vertically oriented on a horizontal surface of the substrate. The photonic device further comprises a plurality of nanowires that chaotically emanates from crystallites in a non-single crystalline material of an inner electrode of the pair. The nanowires connect across the circumferential gap to an outer electrode of the pair. The nanowires are randomly located along the vertical extent of the electrodes. The photonic device further comprises a semiconductor junction between the pair of electrodes.

In other embodiments of the present invention, a nanowire-based photonic device array is provided. The array comprises an outer electrode having an interconnected pattern of cells on a horizontal substrate. The array further comprises a plurality of inner electrodes coaxially arranged with the outer electrode one per cell. The inner electrodes are separated from the outer electrode in the cells by respective circumferential gaps. The outer electrode and the inner electrode have vertical extents relative to the horizontal substrate. The array further comprises a plurality of nanowires chaotically emanating from the inner electrodes. The nanowires connect across the respective circumferential gaps to the outer electrode of the cells. The nanowires are randomly located along the vertical extents. The array further comprises a semiconductor junction between the inner electrodes and the outer electrode of the cells.

Certain embodiments of the present invention have other features that are one or both of in addition to and in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1A:
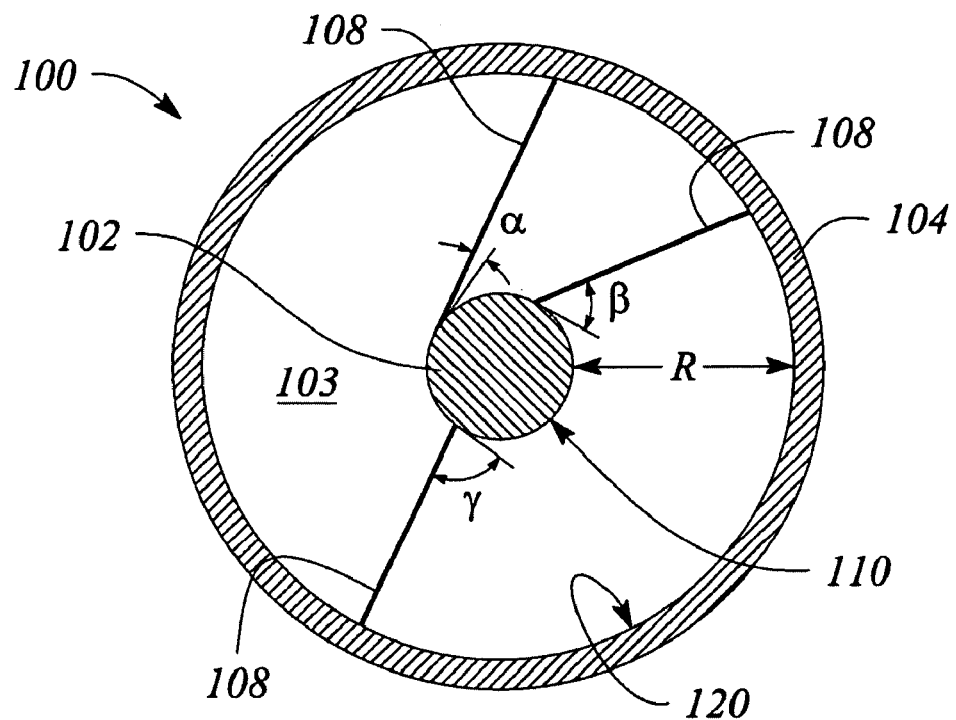
FIGS. 1A-1B illustrate schematic top views of coaxially arranged electrodes with exemplary nanowire interconnections according to some embodiments of the present invention.

Embodiments of the present invention provide a nanowire-based photonic device and an array of photonic devices that each employs a plurality of nanowires as an active component between a pair of coaxially arranged electrodes. The coaxially arranged electrodes are supported by a substrate. The coaxial electrodes have vertical extents relative to a horizontal extent or surface of the substrate. The pair of coaxially arranged electrodes comprises an inner electrode and an outer electrode that surrounds the inner electrode. The inner electrode is physically separated from the outer electrode by a circumferential gap. The nanowires chaotically emanate from a vertical surface of the inner electrode and connect across the circumferential gap to a vertical surface of the outer electrode that faces the inner electrode. The nanowires chaotically emanate in random lateral directions with random angular orientations from the inner electrode surface.

In some embodiments, the inner electrode has a cylindrical shape with a curved surface along its vertical extent that faces the outer electrode. In horizontal cross section, the inner electrode may have any curved profile ranging from a circle to an ellipse, for example, that is uniform along the vertical extent of the inner electrode. In other embodiments, the horizontal cross section of the cylindrical shaped inner electrode is non-uniform along its vertical extent. In some embodiments, the inner electrode has a cylindrical shape with planar surfaces along its vertical extent that faces the outer electrode. In horizontal cross section, the inner electrode has a polygonal profile, for example. In some embodiments, the inner electrode has a conical shape along its vertical extent with a regular taper, where the inner electrode gradually decreases in width from one end to the other. In some embodiments, the conical shaped inner electrode may have an irregular taper along its vertical extent. For example, rather than decreasing gradually, some portions of the inner electrode will increase and then decrease along its vertical extent. Moreover, the inner electrode may be either solid or have a hollow center.

In some embodiments, the outer electrode is a hollow cylinder with a curved outer surface along its vertical extent. In horizontal cross section, the outer electrode may be any curved profile ranging from a circle to an ellipse, for example. In other embodiments, the outer electrode is a hollow cylinder with planar outer surfaces along its vertical extent. In horizontal cross section, the outside profile of the outer electrode is a polygon, while the inside profile of is curved or planar, depending on the embodiment. The inside vertical surface of the outer electrode that faces the inner electrode may have a variety of contours from planar to curved.

In some embodiments, the plurality of nanowires is orientation insensitive with respect to connecting between the electrodes of the device due to the coaxial arrangement of the electrodes. For example, a nanowire emanating from the inner electrode at any angular orientation will extend across the circumferential gap to ultimately contact the outer electrode.

FIG. 1A is a schematic top view of a pair 100 of coaxially arranged electrodes with exemplary nanowire interconnections according to an embodiment of the present invention, which illustrates an example of the orientation insensitivity of the nanowires. For example, FIG. 1A illustrates a geometry of the coaxial electrodes that increases a number of randomly oriented nanowires that bridge between the pair 100. When viewed from the top, an inner electrode 102 of the pair 100 has a uniform circular shape with a surface 110 that is curved by ways of example. The inner electrode 102 is coaxially located inside an outer electrode 104 of the pair 100 that has hollow circular shape with a uniformly curved inner surface 120, also by way of example. The inner electrode 102 curved surface 110 faces the curved surface 120 of the outer electrode 104. A circumferential gap 103 separates the respective facing surfaces 110, 102. The gap distance between the surface 110 of the inner electrode 102 and the surface 120 of the outer electrode 104 is distance R. Three nanowires 108 are illustrated by way of example that emanate from the surface 110 of the inner electrode 102 and connect to the surface 120 of the outer electrode 104. One nanowire 108 has an angle α from the curved surface 110; another nanowire 108 has an angle β from the curved surface 110; and a third nanowire 108 has an angle γ measured from the curved surface 110. The angles of the nanowires 108 are related as α<β<γ by way of example. FIG. 1A illustrates that no matter what the angle is of a nanowire emanating from the inner electrode 102 as measured from a plane tangent to the curved surface (i.e., tangent to horizontal cross section), the nanowire will reach the outer electrode 104 with a small±deviation from the distance R, unless the nanowire 108 grows at an angle that is too acute relative to the vertical extent of the inner electrode 102 (from a side view that is not illustrated).

Figure 1B:
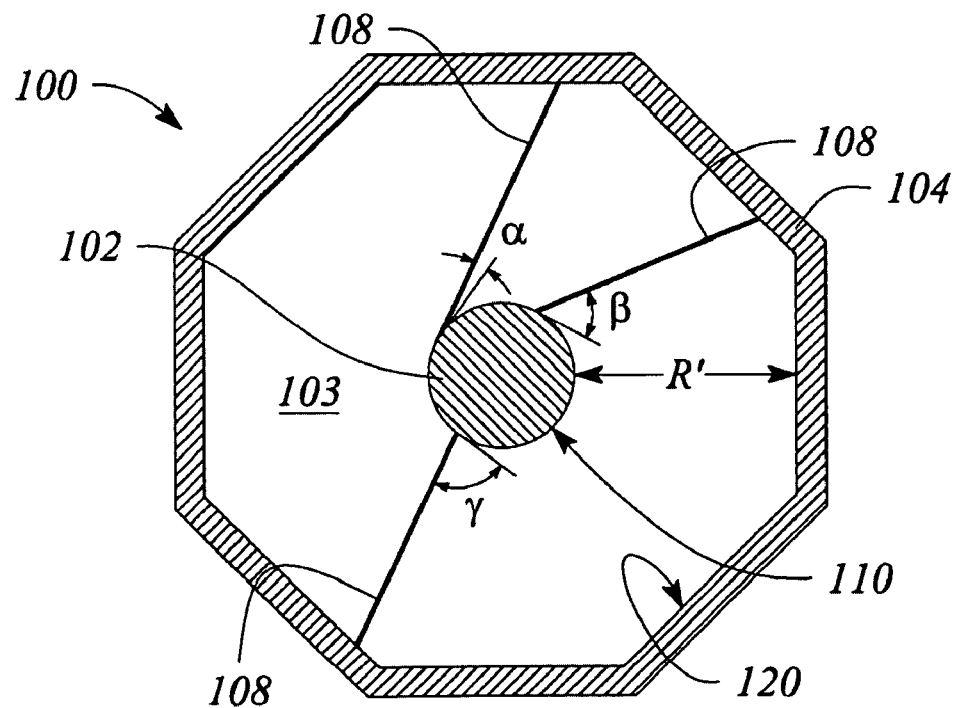

In another example of the orientation insensitivity of the nanowires, FIG. 1B is a schematic top view of another pair 100 of coaxially arranged electrodes with exemplary nanowire interconnections according to an embodiment of the present invention. In FIG. 1B, the inner electrode 102 of the pair 100 has a circular shape when viewed from the top with a surface 110 that is curved. The outer electrode 104 of the pair 100 that has hollow polygonal shape when viewed from the top with relatively planar surfaces 120. Relatively planar inner surfaces 120 of the outer electrode 104 face the curved surface 110 of the inner electrode 102 in this example. The circumferential gap between respective surfaces 110, 120 of the electrodes 102, 104 has a distance R' that varies around the gap. Again, three nanowires 108 are illustrated with respective angles α<β<γ by way of example. Notwithstanding the variability of the distance R' in the circumferential gap 103 of this coaxial arrangement, FIG. 1B further illustrates that no matter what the angle is of a nanowire 108 emanating from the inner electrode 102 as measured from a plane tangent to the curved surface (i.e., tangent to horizontal cross section), the nanowire 108 will reach the outer electrode 104 with a small±deviation from the distance R'. As mentioned above, this is so unless the nanowire 108 grows at an angle that is too acute relative to the vertical extent of the inner electrode 102 (from a side view that is not illustrated).

In other words, the geometric of the pair 100 of electrodes improves the chances of a nanowire reaching from the inner electrode to the outer electrode when the nanowire 108 grows within, for example, about ±70 degrees of the perpendicular to the vertical extent of the inner electrode 102 (when viewed from the side). There will be some nanowires not in the plane of the FIGS. 1A-1B, for example, nanowires that originate from the inner electrode 102 and grow at an angle upwards or downwards and in and out of the plane of the FIGS. 1A-1B. Except for very acute angles (e.g., less than about 20 degrees), these nanowires will also intersect with the outer electrode 104 or with other nanowires. In some embodiments, the number of very acute angled nanowires is reduced by reducing the respective distance R and R' between the inner electrode 102 and the outer electrode 104 to a few micrometers. For example, where the distance R and R' is reduced to a range from about 1 micrometer (i.e., micron) to about 10 microns. In some embodiments, the distances R and R' are dependent on a ratio of a diameter of the inner electrode 102 to a diameter of the outer electrode 104. In some embodiments, as long as the nanowire 108 grows relatively perpendicular (or within ±45 degrees of a perpendicular) to the vertical surface of the inner electrode 102 (as viewed from the side), the nanowires will connect between the pair 100 of electrodes.

In accordance with the various embodiments herein, the plurality of nanowires emanates from the inner electrode chaotically due to the random lattice structure of a material at the vertical surface of the inner electrode. The inner electrode comprises a material With a non-single crystalline structure at its vertical surface; while the outer electrode comprises a material with either a non-single crystalline structure or a single-crystalline structure at its vertical surface that faces the inner electrode, as mentioned above. The nanowires are a single crystalline material. A 'non-single crystalline' structure is defined herein to include within its scope a microcrystalline structure, a polycrystalline structure and an amorphous structure, according to the various embodiments herein.

A 'microcrystalline' structure is defined as a crystalline structure with short range atomic ordering that lacks any long-range atomic ordering. In contrast, as used herein, a 'single crystalline' structure has a crystal lattice structure that is essentially continuous in micrometer scale, as generally defined for a single crystal (i.e., has long-range atomic ordering). The microcrystalline structure is a subset of the polycrystalline structure, which by definition herein, also has short range atomic ordering. The short range atomic order of a microcrystalline structured material has a much smaller extent than the short range atomic order of a polycrystalline structured material. For example, the short range atomic ordering (or order) of a microcrystalline material ranges in extent from about 1 nanometer (nm) to about 500 nm, in accordance with some embodiments of the present invention. By way of example, a polycrystalline material has short range atomic ordering with a much larger extent that ranges from about 0.01 nm to about 100 microns, in accordance with some embodiments of the present invention. An 'amorphous' structure is defined as having very small ('minuscule') crystallites relative to the size of crystallites in the microcrystalline and polycrystalline structures, but nevertheless a crystalline structure. As such, the term 'non-single crystalline' is used collectively to refer to materials having a structure that is one of a microcrystalline, polycrystalline and amorphous for the purposes of the various embodiments of the present invention, unless a distinction is necessary for clarity of discussion.

The short range atomic ordering of each of a polycrystalline material, a microcrystalline material and an amorphous material manifests as multiple, small regions of crystalline material or 'crystallites' dispersed within and generally throughout the material. The regions of crystallites may range from clusters of individual crystallites to discrete individual crystallites of respective decreasing size. Thus, by definition, a layer of any of a polycrystalline material, a microcrystalline material and an amorphous material each comprises multiple crystallites buried in an amorphous matrix. The crystallites have random lattice orientations with respect to one another in the amorphous matrix. Adjacent crystallites within the non-single crystalline material layers have respective lattices that are essentially randomly oriented with respect to one another. Further, crystallites adjacent to a surface of the non-single crystalline material layer are essentially randomly located across the surface. The crystallites in the non-single crystalline materials essentially define the short range atomic ordering of the material.

With respect to the various embodiments of the present invention, the non-single crystalline material, as defined herein, provides a template for nucleation and growth of a single crystalline nanometer-scale semiconductor structure (i.e., 'nanostructure'). In particular, a crystallite in the layer of either the microcrystalline or polycrystalline material provides a nucleation site for growth of a single crystalline nanostructure. Moreover, a crystallite-sized area can be induced within an amorphous matrix by nucleating single crystalline nanostructures. For example, during nanowire growth, an amorphous layer of silicon may have local interactions to form a microcrystalline region that becomes more favorable for nanowire growth. Herein, a 'crystallite-sized area within an amorphous matrix' is also referred to as a 'crystallite' for simplicity of discussion. The random orientations and distribution of the crystallites dictate both random orientations and random locations of the nanostructure on the non-single crystalline material layer. The nucleation site includes within its scope, but is not limited to, growing one or more nanostructures either from a single crystallite or from an aggregate or cluster of crystallites of the non-single crystalline material, depending on the size of crystallites.

For example, if the size of a single crystallite is 'large' compared to the size of a nanostructure, more than one nanostructure may grow from the single crystallite. On the other hand, if the size of a single crystallite is 'small' compared to the size of the nanostructure, but many such crystallites aggregate to form a large crystallite area, then a single nanostructure, or even multiple nanostructures, can grow from such a group of crystallites. In some embodiments, in a space between two adjacent nanostructures (i.e., nearest neighbors) that are integral to respective crystallites of the non-single crystalline layer, the structure of the non-single crystalline layer material is either the amorphous matrix or another crystallite. As used herein, the term 'crystallite' means a range of crystallites from a single crystallite to a group of crystallites aggregated together, as well as the crystallite-sized area of an amorphous material layer, for the purposes of the various embodiments of the present invention.

The grown single crystalline nanostructure forms an interface with the crystallite where the nanostructure is connected to the crystallite commensurately. As such, the single crystalline nanostructure nucleated from the crystallite is said to be 'integral to' the non-single crystalline material (i.e., integral to a crystallite of the material). The term 'integral to' with respect to the single crystalline nanowire and the non-single crystalline material is defined herein to mean that the crystallites of non-single crystalline material and the single crystalline nanowires form an interface where the lattice of the nanowires is coherent with the lattice of the respective crystallites. As such, a 'hetero-crystalline junction' is formed. The coherent lattices of the hetero-crystalline materials (i.e., single crystalline and non-single crystalline materials) facilitate charge carrier transport through the interface, for example.

The term 'hetero-crystalline' is defined herein as a structure comprising at least two different types of structural phases. For example, a hetero-crystalline structure comprises a material with a non-single crystalline structure, as defined herein, and a material with a single crystalline structure that is integral to a crystallite of the non-single crystalline material. The nanowire-based device embodiments of the present invention comprise a hetero-crystalline structure and as such, a hetero-crystalline junction.

Moreover, the nanowire-based device comprises a semiconductor junction. A 'semiconductor junction' as used herein refers to a junction formed within a semiconductor material between two differently doped regions thereof. For example, a junction between a p-doped region and an n-doped region of the semiconductor material is referred to as a p-n semiconductor junction or simply a p-n junction. The p-n junction includes asymmetrically doped semiconductors junctions such as, but not limited to, $p^+$-n junctions where '$p^+$' denotes a relatively higher concentration of the p-type dopant compared to the n-type dopant. A semiconductor junction in which an intrinsically doped region (i-region or layer) lies between and separates the p-doped region and the n-doped region is generally referred to herein as a p-i-n semiconductor junction or simply a p-i-n junction.

The term 'semiconductor junction' as used herein also refers to complex junctions that may include one or more of layers of different semiconductor materials (e.g., GaAs and GaAlAs), layers of semiconductor materials having different band gaps, layers of different doping concentrations (e.g., p, $p^+$, $p^-$, $p^{++}$, n, $n^+$, $n^-$, $n^{++}$, i, etc.), and doping concentration gradients within and across layers. Junctions joining such different semiconductor materials are typically referred to generically as either heterostructure junctions or simply heterojunctions. For example, semiconductor materials having differing band gaps are employed to respectively realize the single crystalline nanowires and the non-single crystalline semiconductor electrode material of some embodiments of the present invention.

Moreover, a Schottky junction is a semiconductor junction between a metal and a semiconductor. Semiconductor junctions between an n-type semiconductor and a p-type semiconductor (of the same one or of a different material) are also often referred to as 'diode junctions' and are the basis for many nanowire-based devices such as, but not limited to, light emitting diodes (LEDs), many semiconductor lasers, and diode photodetectors. Herein, the term 'semiconductor junction' is defined to include within its scope all of the junctions listed above. No distinction is made herein between various specific types of junctions (e.g., p-n, p-i-n, $p^+$-n, $p^{+-}$-n, heterojunction, Schottky, etc.) unless such distinction is necessary for proper understanding.

As provided above, the plurality of nanowires is integral to (i.e., nucleated and grown from) crystallites of the non-single crystalline material on the vertical surface of the inner electrode. As such, the nanowires have the crystal lattice information from the crystallite and have random orientations relative to surface of the inner electrode (i.e., 'chaotically emanate'). The random orientations of the nanowires are dictated by the random lattice orientations of the crystallites in the non-single crystalline material at the surface of the inner electrode that nucleate their growth. In particular, individual nanowires within the plurality are associated with the short-range atomic ordering of the non-single crystalline material. For example, crystallographic information associated with the short-range atomic ordering is transferred to the nanowires during growth of the nanowires with a single crystalline structure.

For the purposes of the various embodiments herein, the term 'chaotically emanating' with respect to the nanowires is defined as a plurality of nanowires that both (1) originates from crystallites in a non-single crystalline material and (2) has a 'tangled' or randomly oriented lateral extent across the circumferential gap as connected to the outer electrode. By definition the term 'chaotically emanating' includes the term 'chaotically connecting' within the scope of its definition. Moreover, the term 'chaotically emanating' nanowires is defined as a 'non-uniform' plurality of nanowires or a plurality of randomly oriented nanowires in which the nanowires have a wide distribution of angular orientations with respect to the vertical surface from which the nanowires emanate. The wide distribution of angular orientations is related to the non-uniform lattice orientations of the crystallites to which the nanowires are coherently attached (i.e., integral to).

The term 'wide distribution of angular orientations' of the non-uniform plurality of nanowires means that the nanowires have a broad range of angular orientations and lateral directions where no angular orientation or lateral direction is predominant over other angular orientations or lateral directions (i.e., 'non-uniform'). In other words, there is no predetermined order, no resulting order and no pattern (e.g., repeating pattern) to the angular orientations and lateral directions of the nanowires. This is in stark contrast to a uniform array of nanowires, where most of the nanowires are expected to and do grow in a primary direction and angle or in a repeating or regular pattern on a single crystalline material or on a layer of uniform nanocrystals or nanoparticles.

Ultimately, a randomness (i.e., width) of the distribution is related to a randomness of lattice orientations of the crystallites in the non-single crystalline material at the surface of the inner electrode. In contrast, nanowires that grow on a single crystalline material or on a layer of nanocrystals or nanoparticles are substantially uniformly oriented with the uniform crystal lattice orientation of the single crystals. For example, nanowires emanating from a single crystalline material on a curved surface may extend substantially radially from the surface or in a uniform fashion. Therefore, the angular orientations of nanowires integral to a single crystalline material or a layer of nanocrystals or nanoparticles have a negligible distribution of angular orientations relative to the wide distribution of angular orientations of the nanowires integral to a non-single crystalline material according to the various embodiments herein.

The integral crystal-structure connection at the interface between the non-single crystalline material and the single crystalline nanowires (hetero-crystalline junction or structure) facilitates using the interface in a variety of semiconductor junction-related applications of the nanowire-based photonic device including, but not limited to, optoelectronic device (e.g., photodetectors, solar cells, light emitting diodes (LEDs), and lasers) and electronic device (e.g., tunneling diodes and transistors) applications. Such devices are collectively referred to herein as a 'photonic' device unless a distinction is necessary. The nanowire-based photonic device according to various embodiments herein may have enhanced device performance due to the combined contributions of the integral non-single crystalline electrode/single crystalline nanowire interfaces (hetero-crystalline junctions) and the additional surface area provided by the plurality of nanowires connecting between the coaxial electrodes in a chaotic or non-uniform manner.

For example, the plurality of nanowires chaotically connecting between the coaxially electrodes may provide one or both enhanced light absorbing characteristics and enhanced antireflective characteristics to solar cell and photodetector photonic device embodiments of the present invention. Effectively, the random orientations of the nanowires increase the probability that photons will interact with and be absorbed by the nanowires rather than be lost (e.g., reflected) to the surroundings. Typical antireflective (AR) coatings absorb light in one or both of a relatively narrow band of frequencies and a relatively narrow range of polarizations and are directionally dependent. In contrast, the chaotically connecting nanowires is light absorptive both in a wide band of optical frequencies and over a wide range of incident angles, such that negligible light is reflected from the non-uniform plurality of nanowires. The chaotically connecting nanowires provide overall better light trapping ability than typical AR coatings. Thus, in some embodiments, the chaotically connecting nanowires are useful in a wider range of applications to convert light to other forms of energy that may be beyond the capabilities of typical AR coatings.

For the purposes of the various embodiments herein, a nanowire is an individual quasi-one dimensional, nano-scale structure typically characterized as having two spatial dimensions or directions that are much less than a third spatial dimension or direction. The presence of the third, greater dimension in nanowires facilitates electron wave functions along that dimension while conduction is quantized in the other two spatial dimensions. As used herein, the term 'nanowire' is defined as a single-crystalline nano-scale structure, as described hereinabove, having an axial length (as a major or third spatial dimension), opposite ends and a solid core. In some embodiments, the nanowire comprises a semiconductor material.

Also for the purposes of the various embodiments herein, the nanowire may be one of larger than, smaller than and the same size as the crystallite to which it is integrally attached. Moreover, the nanowire may one or both of have dimensions from tens of nanometers to several hundred nanometers and not have the same dimension along the entire length of the nanowire, for example. As such, the nanowire may have a tapered shape or a non-tapered shape and such shape may be uniform or non-uniform along the axial length of the nanowire. In some embodiments, a cross-sectional width dimension of the nanowires ranges from about 40 nm to about 500 nm. In some embodiments, the width dimension of the nanowires is not less than about 100 nm. For both photonic device applications and antireflection applications, wider nanowires provide better absorption of photons than narrower nanowires in some embodiments. Moreover, the band gap of the nanowire material mats be less blue-shifted for wider nanowires than for narrower nanowires in some embodiments.

Another nanostructure that may be used to connect between the coaxial electrodes in some embodiments is a nanotube. A nanotube is characterized as having two spatial dimensions or directions that are much less than a third spatial dimension or direction. In some embodiments, the nanotube is a semiconductor material. A 'nanotube' is defined as a single-crystalline nano-scale structure having an axial length (as a major or third spatial dimension), opposite ends and, in contrast to a nanowire, has a hollow core.

In some embodiments, the nanostructure comprises a nanodot (i.e., a quantum dot (QD)) integrally connected between one end of the nanowire and the crystallite of the non-single crystalline material. As used herein, a nanodot is a single crystalline, quasi zero-dimensional nanostructure that is nanometer-scale (i.e., nano-scale) in all three spatial dimensions or directions and electron wave functions in the nanodot is quantized in all three spatial dimensions. The term 'nanowire' may be used herein to collectively refer the above-described single crystalline nanostructures unless a distinction is necessary.

Each of the above-mentioned nanostructures may be nucleated and grown from non-single crystalline materials, as defined herein, according to the various embodiments herein. An exemplary list of materials useful for the embodiments of the present invention is provided below. As such, a wide variety of materials are available to manufacture the nanowire-based device embodiments of the present invention. The wide variety of available non-single crystalline materials may facilitate the plethora of above-mentioned potential device applications including, but not limited to, a solar cell, a photodetector, a photodiode, an LED, a transistor and a laser according to various embodiments herein.

In addition, using a wide variety of non-single crystalline materials may provide cost and manufacturing advantages as well as performance advantages to a nanowire-based photonic device according to some embodiments. For example, a solar cell device that can be manufactured using non-single crystalline semiconductor materials with single crystalline nanostructures may be one or both of more cost-effective to make and more efficient compared to conventional solar cells based on single crystalline silicon with single crystalline nanostructures, according to some embodiments, simply due to the fact that expensive single crystal substrates/layers are not necessary and a broader range of materials that are available for solar cell structures. Material and relevant manufacturing costs for non-single crystalline semiconductor materials are generally cheaper than those for single crystalline semiconductor materials. Moreover, the greater variety of these available materials may provide for energy, conversion from more of the solar spectrum than previously available, which may improve solar cell efficiency according to some embodiments. In addition, some of the photonic device embodiments of the present invention provide for smaller or more compact construction.

Likewise, incorporating a plurality of nanowires integral to the non-single crystalline material provides sufficient non-uniformity to the plurality of nanowires that translates to one or both of increased surface area for photon capture and increased probability that photons will interact with the nanowires or the semiconductor junctions of the photonic device. As such, one or both of light absorption and antireflection may be enhanced in some embodiments. The increased surface area and the increased probability are relative to photonic devices that incorporate predominantly substantially perpendicular nanostructures (e.g., a relatively ordered and uniform array of nanowires) or incorporate typical AR coatings. For example, various embodiments of the invention may provide solar cells with greater energy conversion efficiency compared to conventional single crystalline solar cells using one or both of predominantly substantially perpendicular nanowires or typical AR coatings.

Moreover, in some embodiments, using coaxially arranged electrodes with a non-uniform plurality of nanowires in a circumferential gap between the coaxial electrodes ensures a likelihood that, regardless of the random orientations of the nanowires, the nanowires will connect between the coaxial electrodes. The more nanowire connections that are made between the electrodes, the more electrical current may be generated by the nanowire-based solar cell and photodetector devices in response to absorbed photons, for example.

For the purposes of the various embodiments herein, the article 'a' or 'an' is intended to have its ordinary meaning in the patent arts, namely 'one or more'. For example, 'a nanowire' means 'one or more nanowires' and as such, 'the nanowire' means 'the nanowire(s)' herein. Moreover, 'a crystallite' means 'one or more crystallites' and includes within its scope 'a group of crystallites', as defined above. It is irrelevant whether a particular layer is described herein as being a 'first' layer or a 'second' layer, or being on a top or upper side, a bottom or lower side, or on a left side or a right side of other layers of the photonic device. Therefore, any reference herein to 'first', 'second', 'top', 'bottom', 'upper', 'lower', 'left' or 'right' with respect to the layers is not intended to be a limitation herein. Moreover, examples described herein are provided for illustrative purposes only and not by way of limitation.

The use of brackets '[ ]' herein in conjunction with such numbers as '111' and '110' pertains to a direction or orientation of a crystal lattice and is intended to include directions '< >' within its scope, for simplicity herein. The use of parenthesis '( )' herein with respect to such numbers as '111' and '110' pertains to a plane or a planar surface of a crystal lattice and is intended to include planes '{ }' within its scope for simplicity herein. Such uses are intended to follow common crystallographic nomenclature known in the art.

Figure 2A:
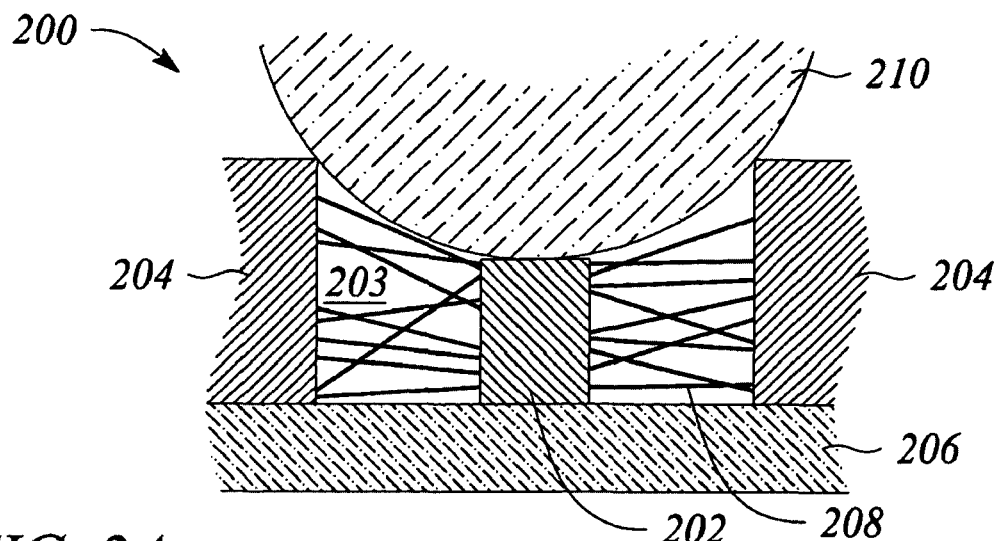
FIG. 2A illustrates a cross sectional view of a nanowire-based photonic device according to an embodiment of the present invention.

In some embodiments of the present invention, a nanowire-based photonic device is provided. FIG. 2A illustrates a cross-sectional view of a nanowire-based device 200 according to an embodiment of the present invention. The nanowire-based device 200 comprises a pair of electrodes 202, 204 in a coaxial arrangement physically separated by a circumferential gap 203 on a substrate 206. The pair of electrodes 202, 204 has a vertical extent and the pair is vertically oriented on a horizontal surface of the substrate 206. The substrate 206 electrically isolates the pair of electrodes 202, 204. A circumferential well is defined in the circumferential gap 203 by the substrate 206 and the coaxial electrodes 202, 204. The nanowire-based device 200 further comprises a plurality of nanowires 208 that chaotically emanate from an inner electrode 202 of the pair. The nanowires 208 extend across the circumferential gap 203 and connect to an outer electrode 204 of the pair. The nanowires 208 have random orientations and are randomly located along the vertical extent of the pair of electrodes 202, 204. The inner electrode 202 comprises a non-single crystalline material on or at the vertical surface. The nanowires 208 originate from and are integral to crystallites in the non-single crystalline material. The nanowires 208 are single crystalline. As such, the nanowire-based device 200 comprises a hetero-crystalline junction. The chaotic nature and randomness of the nanowires 208 are dictated by the randomness of the crystallites in the non-single crystalline material, as described above.

The nanowire-based device 200 further comprises a semiconductor junction, as defined above, between the pair of electrodes 202, 204. Depending on the embodiment, 'between the pair of electrodes' 202, 204 means the semiconductor junction is located one of within the nanowires 208, between the nanowires 208 and the inner electrode 202, between the nanowires 208 and the outer electrode 204 and between the inner electrode 202 and the outer electrode 204. In some embodiments, the semiconductor junction is one or more of the various p-n junctions, as described herein. In some embodiments, the semiconductor junction is a p-i-n junction, in which the intrinsic i-region is located within the nanowires 208 according to various embodiments. The semiconductor junction is not illustrated in FIG. 2A for simplicity of illustration.

In some embodiments, the nanowire-based device 200 comprises a p-i-n semiconductor junction. For example, the inner electrode 202 comprises a p-doped semiconductor material, the outer electrode 204 comprises an n-doped semiconductor material, and the nanowires 208 are an undoped single-crystalline semiconductor material (dopant types not illustrated). In this example, an intrinsic region i is formed by the whole axial length of the nanowires 208 that connect between the pair of electrodes 202, 204. In a variation on the above-described example, only an axial portion of the length of the nanowires 208 is undoped, while adjacent axial portions of the nanowires 208 that connect to the respective electrodes 202, 204 have the same dopant type as the respective electrodes. In this example, the intrinsic region i of the p-i-n junction is less than the whole axial length of the nanowire 208.

In some embodiments, the nanowire-based device 200 comprises a p-n junction. For example, the inner electrode 202 may comprise a p-type dopant material and the nanowires 208 and the outer electrode 204 may comprise an n-type dopant material. The p-n junction is formed in the junction between the inner electrode 202 and the nanowires 208. Since the inner electrode 202 comprises a non-single crystalline semiconductor material and the nanowires 208 are a single crystalline semiconductor material in this embodiment, the p-n junction is formed at the hetero-crystalline junction of the different crystalline structures of the respective semiconductor materials.

In another example, the inner electrode 202 and the nanowires 208 may comprise respective p-doped semiconductor materials, while the outer electrode 204 comprises an n-doped semiconductor material. A p-n junction is formed between the nanowires 208 and the outer electrode 204. In some embodiments, the outer electrode 204 comprises a non-single crystalline semiconductor material at its surface. In these embodiments, this p-n junction is also a hetero-crystalline junction. It is within the scope of the embodiments and examples for the p- and n-dopant types to be reversed among the components 202, 204 and 208 and for any of a variety of doping gradients to be used.

Other variations on the location and doping of the nanowire-based device 200 exist and are within the scope of the present invention. For example, the level of doping in each component 202, 204 and 208 may be the same or different. The variation in dopant level may yield a dopant gradient, for example. In an example of differential doping, the inner electrode 202 may be heavily doped to yield a p+ region providing a low resistivity within the inner electrode 202, while the adjacent axial region of the nanowires 208 may be less heavily p-doped to yield a p region. Various p-n junctions are described and illustrated in co-pending U.S. patent application Ser. No. 11/681,068, which is incorporated herein by reference in its entirety. The nanowire-based device 200 comprises a p-i-n junction according to some solar cell embodiments and photodetector embodiments. The nanowire-based device 200 comprises one or both of a p-n junction and a p-i-n junction in some LED embodiments and laser embodiments. In other applications, the nanowire-based device 200 may comprise a Schottky junction instead of or in addition to one or both of the p-n and p-i-n junction(s).

As described above, the electrodes 202, 204 can have a variety of shapes and profiles. FIG. 2A illustrates that the inner electrode 202 has a uniform cylindrical shape characterized by a vertical extent with a curved vertical surface by way of example. As provided above, a horizontal cross-section of the inner electrode 202 may range from a circle to an ellipse, depending on the embodiment. In some embodiments, the inner electrode 202 is hollow, while in other embodiments, the inner electrode 202 has a solid core. Either of the hollow or solid core may be made of a non-single crystalline material or be coated with a layer of a non-single crystalline material on the vertical surface thereof. FIG. 2A further illustrates that the outer electrode 204 has one of a hollow cylinder shape characterized by a vertical extent. In some embodiments, a horizontal cross-section of the cylindrical outer electrode 204 ranges from a circle to an ellipse on the outside surface. In other embodiments, a horizontal cross-section of hollow cylinder outer electrode 204 has a multi-sided planar outer surface (polygon). In some embodiments, the polygonal shape has four or more sides. In some embodiments, the polygonal shape has at least six sides. The inside vertical surface of the outer electrode 204, which faces the inner electrode 202, may have one or both of curved surface portions and planar surface portions.

Figure 2B:
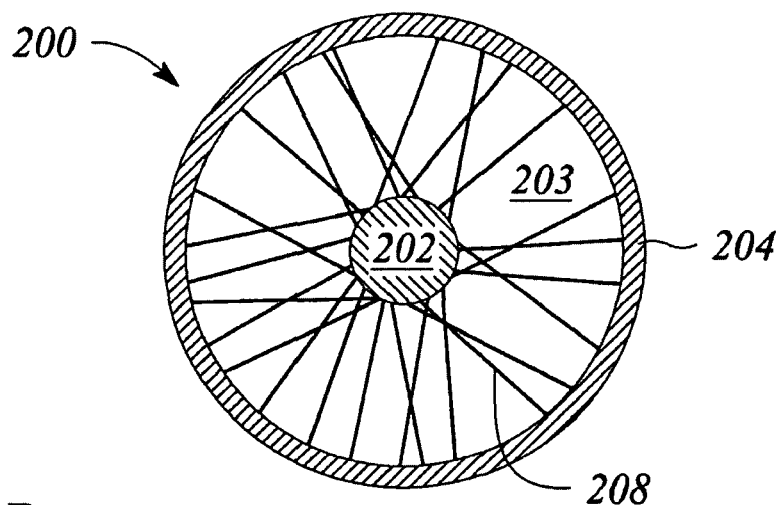
FIGS. 2B-2C illustrate alternate top views of the device illustrated in FIG. 2A according to other embodiments of the present invention.
Figure 2C:
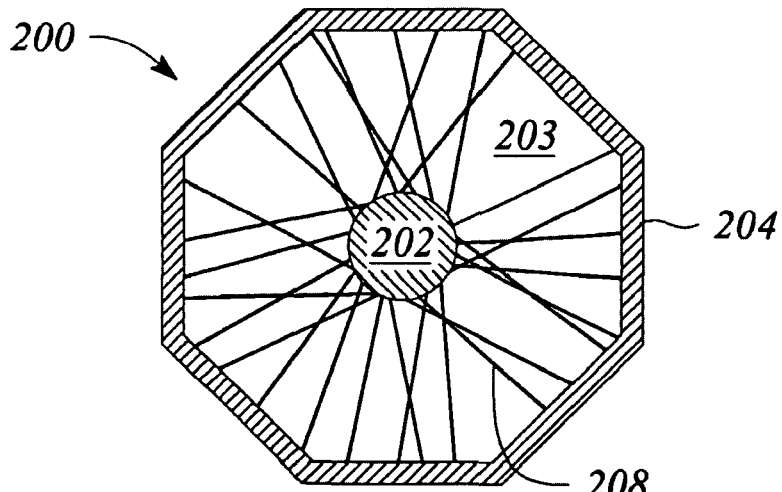

FIG. 2B illustrates a top view of the nanowire-based device 200 of FIG. 2A according to an embodiment. In this embodiment, the inner electrode 202 has a circular shape, which may be solid or hollow, and the outer electrode 204 has a circular shape with both an inside surface and an outside surface. FIG. 2C illustrates a top view of the nanowire-based device 200 of FIG. 2A according to another embodiment. In this embodiment, the inner electrode 202 also has a circular shape, which may be solid or hollow, and the outer electrode 204 has a hollow, polygonal shape with eight sides (i.e., octagon) on both the inside surface and the outside surface. The eight sides of both the inside surfaces and the outside surfaces of the outer electrode 204 are planar, by way of example.

In some embodiments, the inner electrode 202 has a non-uniform cylindrical shape or profile along the vertical extent thereof. For example, the inner electrode 202 may have one or more undulations along its length (not illustrated). A non-uniform profile of the inner electrode facilitates in the distribution of photons to the nanowires 208. In some embodiments, the inner electrode 202 further is a cylindrical lens, or light-pipe, that one or both of guides light to the nanowires 208 that are near a substrate end of the circumferential well (which is formed by the facing vertical surfaces of the electrodes 202, 204 and the substrate 206 in the circumferential gap 203), and helps focus light to the nanowires 208 in the circumferential well. As such, the inner electrode 202 comprises one or both of means for guiding light and means for facilitating focusing of light in the nanowire-based device 200, in some embodiments.

In some embodiments, the outer electrode 204 comprises one or more of a variety of profiles for the inside surface of the outer electrode 204. For example, the inside surface of the outer electrode 204 may have one or more convex portions, concave portions and planar portions. In some embodiments, the horizontal surface of the substrate 206 comprises one or more of a variety of profiles within the circumferential gap 203. For example, the horizontal surface of the substrate 206 includes, but is not limited to, concave, convex, planar, and V-shaped profiles, and includes any combination these profiles. The variety of profiles of the inside surface of the outer electrode 204 and the variety of profiles of the horizontal surface of the substrate 206 each facilitates focusing photons in the circumferential well for interaction With the plurality of randomly oriented nanowires 208. For example, a concave portion of the substrate at the bottom of the circumferential well facilitates refocusing photons back onto the nanowires 208 that may not have been absorbed initially. In some embodiments, the variety of profiles described herein is means for one or both of distributing and facilitating focusing photons in the nanowire-based device 200.

Referring back to FIG. 2A, in some embodiments, the nanowire-based device 200 further comprises a lens 210 adjacent to an end of the pair of electrodes 202, 204 that is opposite to the substrate 206. In some embodiments, the lens 210 is attached to the nanowire-based device between a periphery of the lens 210 and the outer electrode 204. The lens 210 extends over the circumferential gap 203 and is optically transparent. The term 'optically transparent' is defined herein to mean either transparent or semi-transparent to electromagnetic radiation in one or more of the visible, UV and IR spectrums. The lens 210 provides protection to the plurality of nanowires 208 in the circumferential gap while allowing photons to enter the gap 203. Moreover, the lens 210 focuses photons into the circumferential gap 203 of the nanowire-based device 200. The lens 210 has a variety of shapes that facilitate focusing of light. In some embodiments, the lens 210 is a means for focusing light into the nanowire-based device 200. The variety of shapes of the lens 210 also accommodates the shape of the nanowire-based device.

In some embodiments, the lens 210 has a relatively circular shape. For example, the shape of the lens 210 is a sphere, such as a glass bead. In other examples, the lens 210 is one of a half-sphere shape and a dome shape, wherein the half-sphere side and the dome side is selectively either adjacent to or opposite the end of the nanowire-based device 200. Moreover, the lens 210 may have a multi-faceted surface, for example. In other embodiments, the lens 210 has a relatively planar shape. The planar lens 210 embodiment may have one or more facets that facilitate directing and focusing the light. In FIG. 2A, a portion of a spherical lens 210 is illustrated by way of example. In some embodiments, an inside edge of the outer electrode 204 may include a chamfer (not illustrated) that facilitates holding the spherical lens 210 in place.

As mentioned herein, the plurality of nanowires 208 is integral to crystallites in the non-single crystalline material of the inner electrode 202. The crystallites provide a nucleation site for the epitaxial growth of the single crystalline nanowire during manufacturing of the nanowire-based device 200. As such, the nanowires 208 are also physically anchored to the crystallites of non-single crystalline material of the inner electrode 202 at a first end of the nanowires 208. The crystallites are not illustrated in FIGS. 2A-2D for simplicity of illustration. Moreover, second ends of the nanowires 208 that are opposite to the first ends are connected to an inside vertical surface of the outer electrode 204 that faces the inner electrode 202. The nanowires 208 emanate from the inner electrode 202 laterally in random directions and angular orientations and contact the inside vertical surface of the outer electrode 204.

Moreover, since the crystallites of the non-single crystalline material have randomly oriented crystal lattices in adjacent crystallites, the direction of nanowire growth is essentially random. FIGS. 2A-2D further illustrate the various random and non-uniform directions of the nanowires 208 by way of example. Furthermore, the crystallites are randomly located in the vertical surface of the inner electrode 202 and not all crystallites in the vertical surface will nucleate growth of a nanowire. As such, growth of the nanowires 208 in any particular location on the vertical surface is also essentially random. FIGS. 2A-2D are intended to further illustrate the random locations of the nanowires 208 grown on the vertical surface of the inner electrode 202 by way of example. The plurality of nanowires 208 in the circumferential gap 203 has a wide distribution of angular orientations, as defined above.

In some embodiments, the nanowires 208 are orientation insensitive with respect to the coaxial arrangement of the electrodes 202, 204. As such, all nanowires 208 are illustrated as being in contact with both electrodes 202, 204 by way of example. The orientation insensitive is similar to that described above with respect to the pair 100 of coaxial electrodes and the nanowires 108 illustrated in FIGS. 1A and 1B. In some embodiments, the nanowires 208 are orientation insensitive with respect to the coaxial arrangement of the electrodes 202, 204 as long as the random orientations of the nanowires 208 are initiated from non-single crystalline inner electrode 202 to connect to the outer electrode 204 in these embodiments. It should be noted that some nanowires may one or more of emanate at very acute angles from the inner electrode, cease growing, bend or change directions, and contact another nanowire during growth, for example, and therefore, not reach the outer electrode, and emanate from the inside surface of the outer electrode. The figures herein do not illustrate any of these events for clarity of illustration only.

In some embodiments, the second end of the nanowires 208 comprises a metallic tip. A metallic tip on the second end of the nanowires 208 facilitates an electrical connection to the outer electrode 204. Moreover, in some embodiments, a nanowire may connect with another nanowire as they grow across the circumferential gap 203, as mentioned above. However, in some of these embodiments, one of the connected nanowires also connects to the outer electrode. The metallic tip on the second end of the nanowire may facilitate an electrical connection between nanowires and ultimately to the outer electrode. The metallic tip is not illustrated in FIGS. 2A-2D for simplicity of illustration. In some embodiments, individual nanowires may intersect one another during growth such that the lattices of the individual nanowires merge with one another. Therefore, some nanowires are essentially 'integrally tangled' with other nanowires (not illustrated) as the), traverse the circumferential gap to connect to the outer electrode, in some embodiments.

The inner electrode 202 comprises a non-single crystalline material at its vertical surface. In some embodiments, the outer electrode 204 also comprises a non-single crystalline material on the inside vertical surface facing the inner electrode 202. In some embodiments, the non-single crystalline material is deposited on the surface of the respective electrodes 202, 204. In other embodiments, one or both of the electrodes 202, 204 are formed of non-single crystalline materials, such that an additional non-single crystalline film is not included. The non-single crystalline materials may be the same or different on the electrodes 202, 204. The non-single crystalline material is highly electrically conductive or is rendered highly electrically conductive through doping.

In some embodiments, the non-single crystalline material includes, but is not limited to, a semiconductor, a metal and a metal alloy. In some embodiments, the non-single crystalline material is provided on a base material of the respective electrode 202, 204 as a thin film. In some embodiments, the base material itself of the respective electrodes 202, 204 is the non-single crystalline material. In some embodiments, the non-single crystalline material used herein is a semiconductor material, for example, polycrystalline silicon. In some embodiments, one or both of a metal material and metal alloy material may be used as a non-single crystalline material, for example. In some embodiments, the non-single crystalline material is one of a silicide, a carbide and a nitride of the metal or metal alloy. For example, tantalum nitride (TaN) may be used. The metals and metal alloys have inherent non-insulative character (i.e., an inherent non-insulator or inherently electrically conductive) for an electrode material. In some embodiments, the electrodes 202, 204 may be formed from metal foil layers, for example, a metal foil of non-single crystalline tantalum nitride (TaN) or a single crystalline TaN that further has a polycrystalline silicon film coating on the surface of the TaN electrodes 202, 204.

The non-single crystalline semiconductor materials include, but are not limited to, Group IV semiconductors, compound semiconductors from Group III-V and compound semiconductors from Group II-VI having a non-single crystalline structure, as defined herein. For example, one or both of the inner electrode 202 and the outer electrode 204 may comprise a polycrystalline or a microcrystalline silicon (Si) or a non-single crystalline silicon germanium (SiGe) compound semiconductor. In another example, one or both of the electrodes 202, 204 may comprise gallium arsenide (GaAs) in a microcrystalline film. In another example, the inner electrode 202 may comprise a hydrogenated silicon (Si:H) microcrystalline film while the outer electrode is an optically transparent material. In some embodiments, both the inner electrode 202 and the outer electrode 204 are optically transparent. An optically transparent one or both of the inner electrode 202 and the outer electrode 204 facilitates the passage of photons into the circumferential gap 203 of the nanowire-based device 200 to interact with the plurality of randomly oriented nanowires 208.

In some embodiments, the nanowires comprise a single crystalline semiconductor material. Single crystalline semiconductor materials of the nanowires also independently include, but are not limited to, Group IV semiconductors, compound semiconductors from Group III-V and compound semiconductors from Group II-VI. Therefore, the semiconductor material of the nanowires 208 may be the same as or different from the semiconductor material of one or both of the electrodes 202, 204, depending on the embodiment, but crystal structure the semiconductor material of at least the inner electrode 202 is always non-single crystalline while the nanowires 208 are always single crystalline.

In some embodiments, one or both of the nanowires 208 and the inner electrode 202 independently comprises a material that forms one of a zincblende crystal structure and a diamond crystal structure. For example, zincblende and diamond crystal structures may be more conducive to a metal-catalyzed nanowire growth process than one or both of a wurtzite crystal structure and a rock-salt crystal structure. In some embodiments, one or both of the nanowires and the inner electrode 202 independently excludes materials that form one of the wurtzite crystal structure and the rock-salt crystal structure. A description of crystal lattices and crystal structures can be found in the textbook by Sze, S. M., *Physics of semiconductor Devices,* Second Edition, John Wiley & Sons, Inc. 1981, on pp. 8-12 and in Appendix F, pg. 848, for example.

In some embodiments, concomitant with a choice of semiconductor materials independently used in the nanowires 208 and one or both of the electrodes 202, 204 is a respective energy band gap of the respective materials. In some embodiments of a photonic device application of the nanowire-based device 200, the energy band gap of the nanowires 208 is different from the energy band gap of one or both of the electrodes 202, 204. In some embodiments, the energy band gap of the inner electrode 202 is different from the energy band gap of the outer electrode 204. In other embodiments, the energy band gaps of the inner electrode 202 and the outer electrode 204 are the same. Using materials with different energy band gaps makes the nanowire-based device 200 a heterostructure device.

Figure 2D:
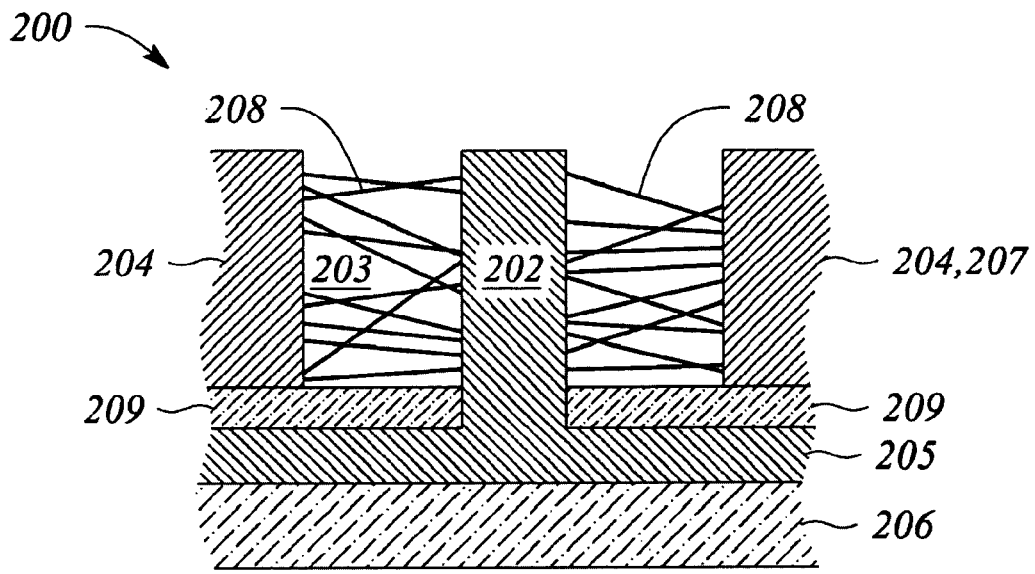
FIG. 2D illustrates a cross sectional view of a nanowire-based photonic device according to an embodiment of the present invention.

In some embodiments, the nanowire-based device 200 further comprises a horizontal substrate 206, as illustrated in FIGS. 2A and 2D. The substrate 206 is adjacent to one end of the pair of electrodes 202, 204. The substrate 206 provides mechanical support to the pair of electrodes 202, 204. In some embodiments, the substrate 206 facilitates the electrical isolation of the pair of electrodes 202, 204. In some embodiments, the substrate 206 may facilitate addition functionality including, but not limited to, separate electrical interfaces to the electrodes 202, 204, focusing of light, and an optically transparent pathways for light to further enter the circumferential gap 203 through the substrate 206 and guiding such light. In general, a broad range of materials are useful as the substrate 206 for the nanowire-based device 200 of the various embodiments herein.

The substrate 206 may be a multilayer substrate or a single layer substrate. FIG. 2A illustrates a single layer substrate 206 and FIG. 2D illustrates a multilayer substrate 206, both in cross-section by way of example. In FIG. 2A, the single layer substrate 206 is an insulating support material. In FIG. 2D, the multilayer substrate 206 has a conductive layers separated by an insulative layer on an insulating support material. A first conductive layer 205 is electrically connected to the inner electrode 204 of the pair. A second conductive layer 207 is electrically connected to the outer electrode 204 of the pair. In some embodiments, the second conductive layer 207 also is the second electrode 204. The insulative layer 209 electrically isolates the conductive layers 205, 207 from one another.

In some embodiments, the insulative layer 209 of the multilayer substrate 206 and the insulating support 206 independently comprises a material that includes, but is not limited to, one or more of a glass, a ceramic, a plastic, a polymer, a dielectric and a semiconductor. In some embodiments, the conductive layers 205, 207 of the multilayer substrate 206 comprises a material that includes, but is not limited to, one or more of a metal, metal alloy and a semiconductor. A substrate material useful for the various embodiments herein includes materials that have one of amorphous crystallographic structure (e.g., relatively minuscule crystallites), a microcrystalline structure (i.e., having short range atomic order, as defined herein), a polycrystalline structure (i.e., having short range atomic order of relatively greater extent than a microcrystalline structure, as defined herein), and a single crystalline structure (i.e., having relatively long range atomic order).

In some embodiments, the substrate material is chosen at least for its ability to withstand manufacturing temperatures at or above about 100 degrees centigrade (° C.). In various embodiments, the substrate 206 may be one of rigid, semi-rigid and flexible, depending on specific applications of the nanowire-based device 200. Moreover, the substrate 206 may be one of reflective, opaque, transparent and semi-transparent to electromagnetic radiation in one or more of visible, ultra-violet (UV) and infra-red (IR) spectrums, depending on the application of the nanowire-based device 200.

Although not illustrated in the figures, the nanowire-based device 200 may further comprise an encapsulant material at least within the circumferential gap 203 that embeds the nanowires 208. The encapsulant material is an insulator material that is optically transparent. In some embodiments, the encapsulant material includes, but is not limited to, one or more of an oxide, a nitride and a carbide of any of the semiconductor materials listed above that is optically transparent. In other embodiments, the encapsulant material may be one or more of an oxide, a nitride, and a carbide of a metal, such as titanium or gallium, for example, that is insulative and optically transparent. In some embodiments, the encapsulant material includes, but is not limited to, a polymer, which is optically transparent, that can withstand device processing temperatures above about 100° C. For example, the polymer insulator material may be an optically transparent polyimide.

In some embodiments, the nanowire-based device 200 further comprises separate electrical contacts (not illustrated) to the pair of electrodes 202, 204. In some embodiments, the electrical contacts separate access the respective electrodes 202, 204 by way of pathways in the substrate 206. In some embodiments, one or both of the respective electrodes 202, 204 is electrically accessed with electrical contacts on the end of the device 200 which is opposite to the substrate 206. The plurality of nanowires 208 is electrically accessible in conjunction with the pair of electrodes 202, 204 by the separate electrical contacts. In some embodiments, the electrical contacts are made from a material that includes, but is not limited to, a conductive metal and a semiconductor material that is doped to provide the level of electrical conductivity for the nanowire-based device 200 application. In some embodiments, the material of the electrical contacts is optically transparent.

In some embodiments, the nanowire-based device 200 illustrated in FIG. 2A or 2D is a photodetector device 200. Photons of light are detected by the plurality of randomly oriented nanowires 208 in the vicinity of the circumferential gap 203. The randomly oriented nanowires 208 facilitates one or both of the capture of a photon in the tangled nanowire plurality and absorption at a p-i-n semiconductor junction of the photodetector device 200, where for example, the nanowires may be undoped and the pair of coaxial electrodes 202, 204 are alternately n-doped or p-doped. Absorption at the p-i-n junction may result in the formation of an electron-hole pair within the p-i-n junction. Movement of the electron and hole in respective separate directions away from the semiconductor junction results in a photocurrent associated with the photodetector device 200. As such, the randomly oriented nanowires 208 connected between the coaxially arranged electrodes 202, 204 facilitate one or more of enhanced light absorption, enhanced antireflection of the light and enhanced photocurrent generation, such that the photodetector device 200 is more sensitive to light and therefore, more mechanically robust as a photodetector than a photodetector without the randomly oriented nanowires between coaxially arranged electrodes. For example, the photodetector 200 may be more mechanically robust than a photodetector with a relatively uniform array of nanowires having substantially uniform angular orientation(s) (i.e., a negligible distribution of angular orientations) between parallel electrodes.

In other embodiments, the nanowire-based device 200 illustrated in FIG. 2A or 2D is a solar cell 200. Photons are captured in the plurality of randomly oriented nanowires 208 in the circumferential gap 203 between coaxial electrodes 202, 204. The randomly oriented nanowires 208 facilitate one or both of the capture of a photon in the tangled nanowire plurality and the likelihood that the photon will interact with a p-i-n semiconductor junction associated with the nanowires 208 and generate an electron-hole pair. The electrodes 202, 204 have low contact resistance to the nanowires 208 and facilitate the extraction of an electric current. As mentioned above with respect to the photodetector 200 application, generation of an electric current (i.e., photocurrent) occurs when the electrons and holes generated by photon absorption at the randomly oriented nanowires 208 move away from the p-i-n junction. For example, the electrons move away in a first direction (e.g., toward the inner electrode 202) and the holes move away in a second, opposite direction (e.g., toward the outer electrode 204) as a result of an electric field gradient associated with the p-i-n junction. As such, the randomly oriented nanowires 208 and the coaxial arrangement of the electrodes 202, 204 facilitate one or more of enhanced light absorption, enhanced antireflection of the light and enhanced electric current production, such that the solar cell device 200 may provide better light conversion efficiency and therefore, may be one or both of more efficient and mechanically robust as a solar cell than a solar cell without the randomly oriented nanowires and coaxial electrodes. For example, the solar cell device 200 may be one or both of more efficient and mechanically robust than a solar cell with a uniform array of nanowires (i.e., having a negligible distribution of angular orientations) between parallel electrodes.

Figure 3A:
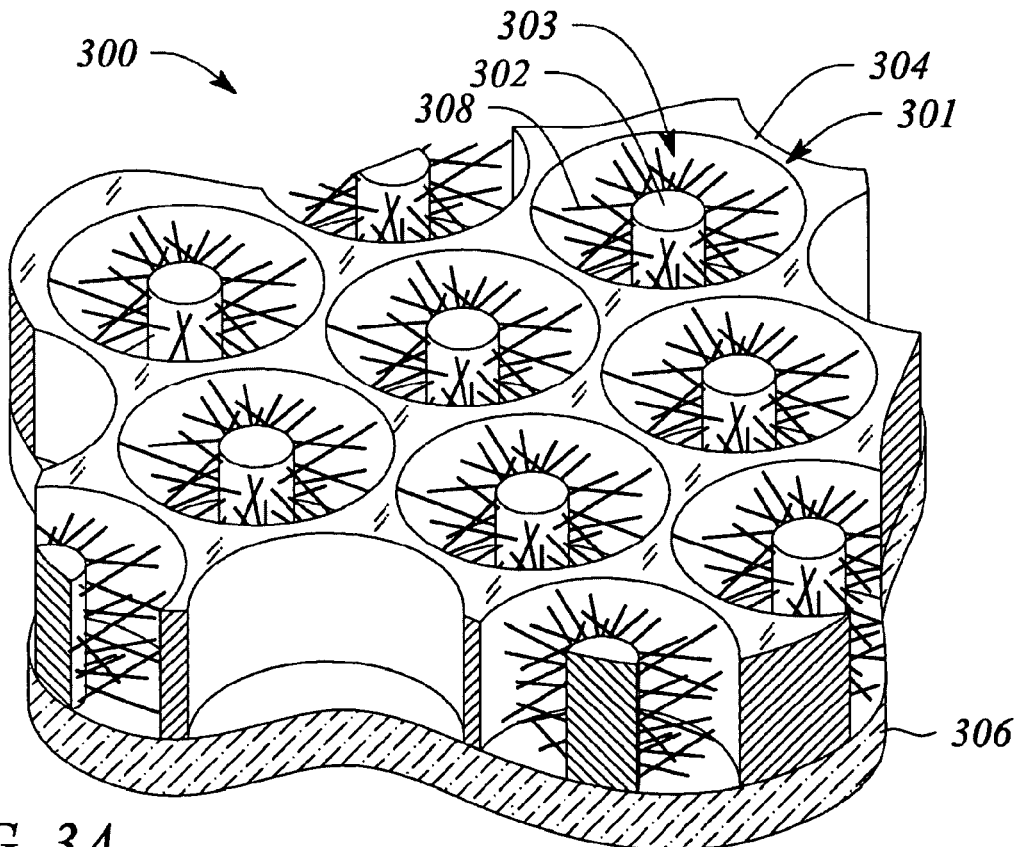
FIG. 3A illustrates a perspective view of a nanowire-based photonic device array according to an embodiment of the present invention.
Figure 3B:
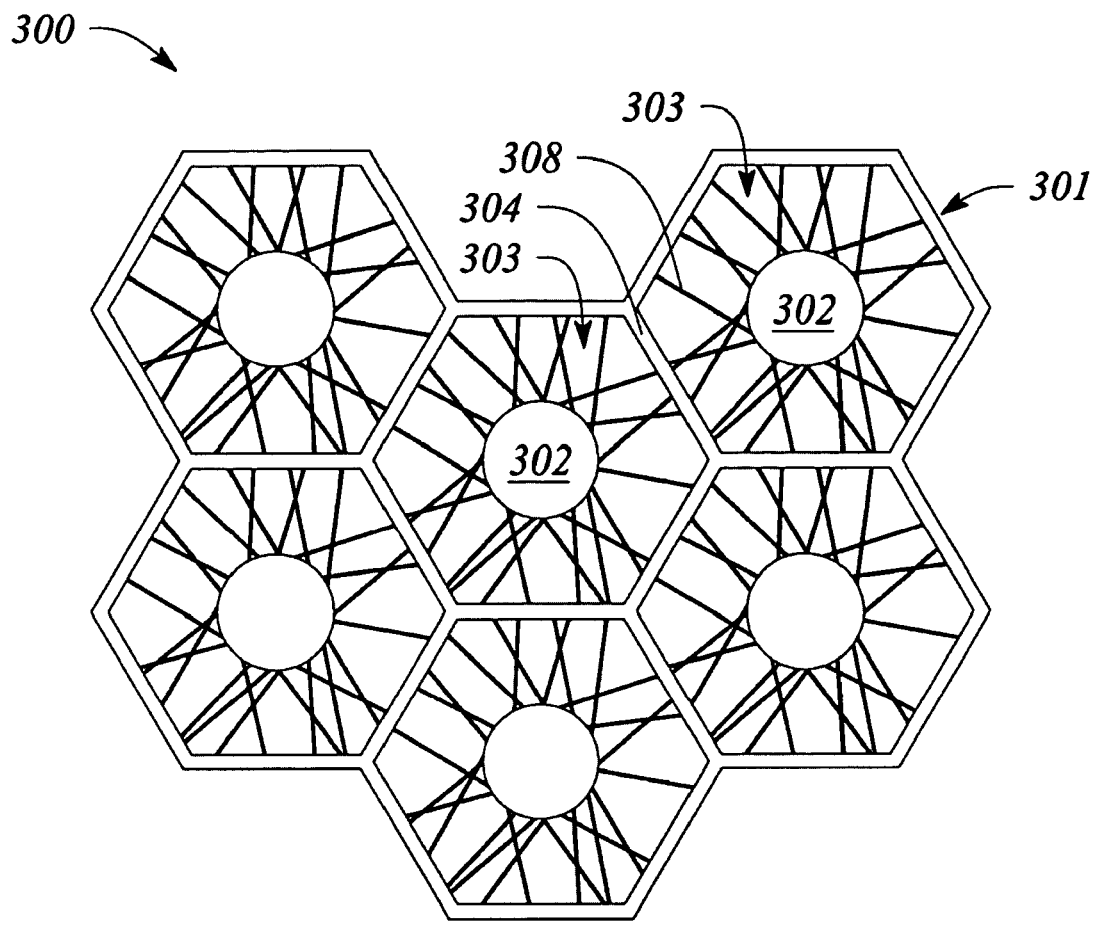
FIG. 3B illustrates a top view of a nanowire-based photonic device array according to another embodiment of the present invention.

In another embodiment of the present invention, an array of nanowire-based photonic devices is provided. FIG. 3A illustrates a perspective view of a nanowire-based device array 300 according to an embodiment of the present invention. The device array 300 comprises an outer electrode 304 having a pattern of cells 301 on a horizontal substrate 306. The pattern of cells 301 comprises a plurality of repeating circular cells or polygonal cells that are interconnected. Circular cells 301 can be anywhere from a round shape to an ellipse. In some embodiments, the polygonal cells 301 are at least four sided in a repeating interconnected pattern. In FIG. 3A, the pattern of cells 301 is a repeating pattern of circular cells 301 by way of example. FIG. 3B illustrates a top view of a nanowire-based device arrays 300 according to another embodiment of the present invention. In FIG. 3B, the repeating pattern of cells 301 is a honeycomb having six sides (hexagonal). Each hexagonal cell 301 is interconnected to another hexagonal cell 301 on at least one side. By 'interconnected', it is meant that either the respective side of the polygon is shared between two adjacent cells 301 or the respective sides of two adjacent cells 301 are attached together.

The device array 300 further comprises a plurality of inner electrodes 302 coaxially arranged with the outer electrode 304 in the cells 301. There is one inner electrode 302 per cell 301 separated from the outer electrode 304 by a respective circumferential gap 303. The outer electrode 304 and the plurality of inner electrodes 302 have respective vertical extents relative to the horizontal substrate 306. The inner electrodes 302 have a cylindrical shape with a horizontal cross-section that ranges from a circle to an ellipse, depending on the embodiment. FIGS. 3A and 3B illustrate circular cylindrical inner electrodes 302 by way of example.

The device array 300 further comprises a plurality of nanowires 308 chaotically emanating from the inner electrodes 302 that connect to the outer electrode 304 across the respective circumferential gaps 303. The nanowires 308 are randomly located along the vertical extents of the electrodes 302, 304 and have a wide distribution of angular orientations from the curved surface of the inner electrode 302.

The device array 300 further comprises a semiconductor junction (not illustrated) between the outer electrode 304 and the respective inner electrodes 302 of the cells 301. In some embodiments, the device array 300 further comprises a lens on an open end of the array 300, which is opposite the substrate 306. In some embodiments, one or more cells 301 has a separate lens on the open end to facilitate focusing light into the respective circumferential gaps 303. The lens is not illustrated in FIG. 3A or 3B for clarity of illustration. In some embodiments, the component parts 302, 303, 304, 306, 308, semiconductor junction and the lens of the device array 300 are similar to the component parts 202, 203, 204, 206, 208, 210 and semiconductor junction of the nanowire-based device 200, according to any of the various embodiments described above.

In some embodiments, the nanowire-based device array 300 is a solar cell array 300, wherein the randomly oriented nanowires 308 that are circumferentially disposed and connected between the electrodes 302, 304 in each cell 301 one or both of facilitate and enhance one or more of light absorption, antireflection and electric current generation. In some embodiments, the nanowire-based device array 300 is a photodetector array 300, wherein the randomly oriented nanowires 308 circumferentially disposed and connected between the electrodes 302, 304 in each cell 301 one or both of facilitate and enhance one or more of light absorption, antireflection and photocurrent generation. In some embodiments, the semiconductor junction is a p-i-n junction wherein the nanowires 308 comprise the intrinsic i region.

In some embodiments, the inner electrode 202, 302 and the outer electrode 204, 304 are formed by stamping metal foil layers to create the coaxial arrangement of electrodes. In some embodiments, the outer electrode 204, 304 is formed by drilling holes in a blank substrate and the inner electrode 202, 302 is formed by creating posts in another blank substrate. The substrates are combined such that the posts are coaxially aligned in the drilled holes and electrically isolated. In some embodiments, the inner electrode 202, 302 has a diameter ranging from about 2 microns to 100 microns and a height ranging from 2 microns to 200 microns. For some photonic applications, an inner electrode 202, 302 height may be about 30 to 40 microns, for example. In some embodiments, the width of the circumferential gap 203, 303 ranges from about 1 micron to about 100 microns. In some embodiments, the width of the circumferential gap 203, 303 is from about 1 micron to 10 microns (i.e., distance R or R'). In some embodiments, the width of the circumferential gap 203, 303 is less than 1 micron (i.e., distance R or R'). In some embodiments, the height or vertical extents of the inner electrode 202, 320 and the outer electrode 204, 304 are the same (FIG. 2D). In some embodiments, the height or vertical extent of the outer electrode 204, 304 is greater than the height or vertical extent of the inner electrode 202, 302 (FIG. 2A).

Depending on the materials used for forming the electrodes, the surface of at least the inner electrode 202, 302 may be further coated with a non-single crystalline material. In some embodiments, a non-single crystalline semiconductor material is deposited using a chemical vapor deposition (CVD) process, such as plasma enhanced CVD (PECVD), and a semiconductor source gas or gas mixture. For example, a microcrystalline silicon film may be deposited using PECVD at a temperature ranging from about 100° C. to about 300° C. and a source gas mixture of silane and hydrogen. In this example, the non-single crystalline material is a microcrystalline hydrogenated silicon film. Other methods of deposition of non-single crystalline films according to the present invention include, but are not limited to, physical vapor deposition, such as sputtering or vacuum evaporation.

In some embodiments, the plurality of nanowires 208, 308 are formed by growing the nanowires on the non-single crystalline surface of the inner electrode 202, 302 using the crystallites to facilitate the growth. In some of these embodiments, growing the nanowires 208, 308 comprises an epitaxial growth process to achieve a single-crystalline semiconductor nanostructure. Nanowires are grown epitaxially using a variety of techniques including, but not limited to, catalytic growth using vapor-liquid-solid (VLS) growth, catalytic growth using solution-liquid-solid (SLS) growth, and non-catalytic growth using vapor-phase epitaxy. Catalytic growth is further characterized by being either metal catalyzed or nonmetal catalyzed. The growth is performed in a chemical vapor deposition (CVD) chamber in a controlled environment using a gas mixture comprising nanowire source materials. During catalytic growth, nanowires grow with certain crystal directions of respective crystallites in the non-single crystalline surface. Since the non-single crystalline structure at the surface of the inner electrode 202, 302 comprises crystallites with random crystal orientations, the nanowires 208, 308 will grow in random directions from some crystallites at the surface of the non-single crystalline material.

For nanodots, the growth is stopped almost immediately after it is started, in some embodiments. In other embodiments, the nanodots form spontaneously on the non-single crystalline layer by so-called self-organized growth driven by strain associated with the difference in lattice constants between the nanodots and the crystallites in the non-single crystalline material. In some embodiments, a nanodot may be grown from the crystallites as a 'seed' from which a nanowire or nanotube is subsequently grown.

Typical catalyst materials are metals and nonmetals. Metal catalyst materials include, but are not limited to, titanium (Ti), platinum (Pt), nickel (Ni), gold (Au), gallium (Ga), and alloys thereof. Nonmetal catalyst materials include, but are not limited to, silicon oxide ($SiO_x$), where x ranges from about 1 to less than 2, for example. Typical nanoparticle catalysts corresponding to Ti and Au catalyst materials, for example, are respectively titanium silicide ($TiSi_2$) and gold-silicon (Au—Si) alloy.

In some embodiments, the nanowires 208, 308 are formed using a catalytic growth process. In some of these embodiments, the catalytic growth process comprises using vapor-liquid-solid (VLS) growth and a metal nanoparticle catalyst. Nanoparticle catalysts are formed on the non-single crystalline surface of the inner electrode 202, 302 using any one of a variety of deposition processes. In some embodiments, a nucleation layer of a catalyst material is deposited on the surface by various types of physical and chemical vapor deposition techniques. The nucleation layer is annealed into activated nanoparticle catalysts on the surface, for example. The activated nanoparticle catalysts are discontinuous on the surface relative to the nucleation layer. In other embodiments, a metal catalyst material is deposited using electrochemical deposition using a deposition solution comprising a salt of the metal catalyst material. In some embodiments, excess catalyst material may be removed from the non-single crystalline surface of the inner electrode 202, 302, for example, by annealing.

In other embodiments, the catalyst particles are suspended in a solution and deposited on the non-single crystalline surface of the inner electrode 202, 302 as droplets. For example, gold colloidal particles dispersed in toluene may be delivered to the surface of in multiple droplets using a pipette, or an inkjet printhead. The toluene may be pumped away in vacuum, leaving the gold nanoparticles on the surfaces to act as catalysts for the VLS growth of the nanowires 208, 308. In this example, the gold colloidal particles have a diameter of about 10 nm and a nominal concentration of about $5 \times 10^{15}$ $ml^{-1}$.

Nanowire growth is initiated in a CVD reaction chamber using a gas mixture of a nanowire source material that is introduced into the chamber at a growth temperature and using nanoparticle catalysts that are located on the crystallites at the non-single crystalline surface of the inner electrode 202, 302. The activated or nucleating nanoparticle catalyst accelerates decomposition of the nanowire source material in the gas mixture, such that adatoms resulting from decomposition of the nanowire source material diffuse through or around the nanoparticle catalyst, and the adatoms precipitate on the inner electrode surface. In particular, the adatoms of the nanowire material precipitate between the nanoparticle catalyst and the non-single crystalline surface at the respective crystallites to initiate nanowire growth. Moreover, catalyzed growth of the nanowire is continued with continued precipitation at the nanoparticle-nanowire interface. Such continued precipitation causes the nanoparticle catalyst to remain at the tip of the free end of the growing nanowire.

The metal-catalyzed growth process provides a metallic tip on the second end of the nanowire 208, 308. The metallic tip comprises the metal nanoparticle catalyst used to catalyze the growth process. The second end of the nanowire 208, 308 connects to the vertical surface of the outer electrode 204, 304 during growth. As described above, the metallic tip facilitates an electrical connection between the nanowire 208, 308 and the outer electrode 204, 304, in some embodiments.

For example, indium phosphide (InP) nanowires may be grown on a microcrystalline hydrogenated silicon film on the inner electrode by metalorganic CVD (MOCVD). In this example, trimethylindium and phosphine in a hydrogen carrier gas are used at a growth pressure of about 76 Torr and temperature of about 430° C. Moreover, a gold-silicon alloy material is used as the metal nanoparticle catalyst. The InP nanowires are anchored to the crystallites in the microcrystalline silicon film at the first end and have metallic tips comprising gold at the second end in this example.

In some embodiments, one or more of the inner electrode 202, 302, the outer electrode 204, 304 and the nanowires 208, 308 are doped, depending on the embodiment. Doping forms a p-n junction that is generally located between the inner electrode 202, 302 and the outer electrode 204, 304. In some embodiments, the p-n junction is any of the p-n junctions (including p-i-n junctions) described above for the nanowire-based device 200. The dopant materials used and the dopant levels achieved are dependent on the device application and not considered a limitation herein. Moreover, a Schottky junction may be formed between one or both of the electrodes and the nanowires, depending on the embodiment.

Thus, there have been described various embodiments of a nanowire-based photonic device and a nanowire-based photonic device array employing coaxially disposed electrodes. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A nanowire-based photonic device comprising:
   a pair of electrodes in a coaxial arrangement separated by a circumferential gap on a substrate, the pair having a vertical extent, the pair being vertically oriented on a horizontal surface of the substrate;
   a plurality of nanowires chaotically emanating from crystallites in a non-single crystalline material of an inner electrode of the pair, the nanowires connecting across the circumferential gap to an outer electrode of the pair, the nanowires being randomly located along the vertical extent; and
   a semiconductor junction between the pair.

2. The nanowire-based photonic device of claim 1, further comprising an optically transparent lens extending over the circumferential gap, the lens being adjacent to an end of the pair of electrodes, an opposite end of the pair being adjacent to the substrate.

3. The nanowire-based photonic device of claim 1, wherein the inner electrode has a cylindrical shape with a curved vertical surface, the curved vertical surface comprising the crystallites of the non-single crystalline material, the outer electrode having a hollow cylindrical shape with one of a curved outer surface and a polygonal outer surface.

4. The nanowire-based photonic device of claim 3, wherein the outer electrode has an inside vertical surface facing a curved vertical surface of the inner electrode, a portion of the inside vertical surface of the outer electrode being one of convex, concave and planar.

5. The nanowire-based photonic device of claim 1, wherein a portion of the substrate in the vicinity of the circumferential gap has one of a convex surface, a concave surface and a V-shaped surface.

6. The nanowire-based photonic device of claim 1, wherein the pair of electrodes has a closed end adjacent to the substrate and an open end opposite to the closed end.

7. The nanowire-based photonic device of claim 1, wherein a non-uniformity of the chaotically emanating plurality of nanowires is light absorptive both in a wide band of frequencies and over a wide range of incident angles, such that negligible light is reflected from the circumferential gap.

8. The nanowire-based photonic device of claim 7, wherein the photonic device is one of a solar cell and a photodetector, the semiconductor junction being a p-i-n junction, the nanowires comprising an intrinsic i region of the p-i-n junction.

9. The nanowire-based photonic device of claim 1, wherein the semiconductor junction is one of within the nanowires, between the inner electrode and the nanowires and between the outer electrode and the nanowires.

10. The nanowire-based photonic device of claim 1, wherein the semiconductor junction is within a hetero-crystalline junction between a single crystalline material of the nanowires and the non-single crystalline material of the inner electrode.

11. The nanowire-based photonic device of claim 1, wherein one or both of the inner electrode and the outer electrode is optically transparent.

12. The nanowire-based photonic device of claim 1, wherein the substrate is a multilayer substrate comprising conductive layers separated by an insulative layer, a first conductive layer being electrically connected to the inner electrode of the pair, a second conductive layer being electrically connected to the outer electrode of the pair.

13. The nanowire-based photonic device of claim 1, wherein the electrodes are one pair of an array of pairs of the electrodes, the outer electrodes of the pairs being interconnected in a honeycomb pattern on the horizontal surface of the substrate, the device being a solar cell array.

14. A nanowire-based solar cell device comprising:
- a pair of electrodes in a coaxial arrangement separated by a circumferential gap on a substrate, the pair having a vertical extent, the pair being vertically oriented on a horizontal surface of the substrate;
- a plurality of nanowires chaotically emanating from crystallites in a non-single crystalline material of an inner electrode of the pair, the nanowires connecting across the circumferential gap to an outer electrode of the pair, the nanowires being randomly located along the vertical extent; and
- a p-i-n junction, the electrodes of the pair being separately a different one of p-doped and n-doped, the plurality of nanowires comprising an intrinsic i region of the p-i-n junction.

15. A nano-wire-based photonic device array comprising:
- an outer electrode having an interconnected pattern of cells on a horizontal substrate;
- a plurality of inner electrodes coaxially arranged with the outer electrode one per cell, the inner electrodes being separated from the outer electrode in the cells by respective circumferential gaps, the outer electrode and the inner electrodes having vertical extents relative to the horizontal substrate;
- a plurality of nanowires chaotically emanating from the inner electrodes, the nanowires connecting across the respective circumferential gaps to the outer electrode of the cells, the nanowires being randomly located along the vertical extents; and
- a semiconductor junction between the inner electrodes and the outer electrode of the cells.

16. The nanowire-based photonic device array of claim 15, wherein the semiconductor junction is within a hetero-crystalline junction between a single crystalline material of the nanowires and a non-single crystalline material of the inner electrode.

17. The nanowire-based photonic device array of claim 15, further comprising an optically transparent lens on an end of the cells that is opposite the horizontal substrate, the optically transparent lens covers the respective circumferential gaps.

18. The nanowire-based photonic device array of claim 15, wherein the outer electrode is optically transparent.

19. The nanowire-based photonic device array of claim 15, wherein the inner electrodes are cylindrical shaped having a curved vertical surface, the plurality of nanowires chaotically emanating from crystallites in a non-single crystalline material of the curved vertical surface.

20. The nanowire-based photonic device array of claim 15, wherein the outer electrode has a vertical surface that faces a vertical surface of the inner electrodes, the inner electrode having a non-uniform vertical extent, a portion of the vertical surface of the outer electrode being one of convex, concave and planar, a portion of the substrate in a vicinity of the circumferential gaps having one of a convex surface, a concave surface and a V-shaped surface.

* * * * *